US007724031B2

(12) United States Patent
Cashman

(10) Patent No.: US 7,724,031 B2
(45) Date of Patent: May 25, 2010

(54) STAGGERED LOGIC ARRAY BLOCK ARCHITECTURE

(75) Inventor: David Cashman, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/726,472

(22) Filed: Mar. 21, 2007

(65) Prior Publication Data

US 2008/0231317 A1  Sep. 25, 2008

(51) Int. Cl.
*H01L 25/00* (2006.01)
*H03K 19/177* (2006.01)
*H03K 17/693* (2006.01)

(52) U.S. Cl. ............................... 326/41; 326/38; 716/16
(58) Field of Classification Search ............. 326/37–41, 326/47; 716/16
See application file for complete search history.

(56) References Cited

U.S. PATENT DOCUMENTS

| 5,977,793 | A | 11/1999 | Reddy et al. |
| 5,999,016 | A | 12/1999 | McClintock et al. |
| 6,107,820 | A | 8/2000 | Jefferson et al. |
| 6,215,326 | B1 | 4/2001 | Jefferson et al. |
| 6,366,120 | B1 * | 4/2002 | Schleicher et al. ............ 326/41 |
| 6,407,576 | B1 | 6/2002 | Ngai et al. |
| 6,590,419 | B1 | 7/2003 | Betz et al. |
| 6,630,842 | B1 | 10/2003 | Lewis et al. |
| 6,897,680 | B2 * | 5/2005 | Schleicher et al. ............ 326/41 |
| 6,937,061 | B1 * | 8/2005 | Crosland et al. .............. 326/38 |
| 7,132,852 | B2 | 11/2006 | Vest et al. |

OTHER PUBLICATIONS

Sivaswamy, S. et al., "HARP: Hard-wired Routing Pattern FPGAs," *FPGA '05*, Feb. 20-22, 2005, Monterey, CA.

* cited by examiner

*Primary Examiner*—Vibol Tan
*Assistant Examiner*—Dylan White
(74) *Attorney, Agent, or Firm*—Ropes & Gray LLP; Robert R. Jackson

(57) ABSTRACT

A staggered logic array block (LAB) architecture can be provided. An integrated circuit (IC) device can include a first group of LABs substantially aligned with each other, and a second group of LABs substantially aligned with each other and coupled to the first group of LABs by a plurality of horizontal and vertical conductors. The first group of LABs can be substantially offset from the second group of LABs in the IC layout. In an embodiment of the invention, the first and second groups of LABs can be columns of LABs, and the columns can be vertically offset from each other (e.g., by half the number of logic elements in each LAB). The offsetting can advantageously allow more LABs to be reached using a single routing channel, or without using any routing channel, thereby reducing communication latency and improving overall IC performance.

15 Claims, 6 Drawing Sheets

STAGGERED LOGIC ARRAY BLOCK ARCHITECTURE

BACKGROUND OF THE INVENTION

This invention can relate to integrated circuit (IC) devices. More particularly, this invention can relate to staggered logic array blocks (LABs) on IC devices.

IC devices are well-known in the art, and can include a plurality of general-purpose programmable logic elements that can be programmed to perform a wide variety of tasks. Using such programmable logic elements allows manufacturers of electronic circuitry to avoid the need to separately design and build individual logic circuits on each IC device. IC devices that use programmable logic elements can include, for example, programmable logic devices (PLDs) and structured application-specific integrated circuits (ASICs). For simplicity, the discussion herein focuses chiefly on PLDs, but it will be understood that the principles of the present invention can also be applied to other types of IC devices.

The basic building block of a PLD is a logic element (LE) that is capable of performing limited logic functions on a number of input variables. Each LE in a PLD typically provides a combinational logic function such as a look-up table (LUT), and one or more flip-flops. To facilitate implementation of complex logic functions, LEs in a PLD are often arranged in groups, to form one or more LABs. For example, each LAB in a PLD may include eight LEs, and the LAB may be programmed to provide any one of a plurality of logic functions by using control bits. The LABs in a PLD, meanwhile, are often arranged in a one-dimensional or two-dimensional array, and are programmably connectable to each other using a PLD routing architecture.

The routing architecture of a PLD typically includes an array of signal conductors having programmable interconnections that are used to route data and output enable signals. For example, the routing architecture can include several horizontal and vertical conductor channels, where each of these channels can include, respectively, one or more horizontal or vertical signal conductors. In addition, the conductors in a given channel can span all of the LABs in a given row or column or, alternatively, can span only a subset of the LABs in the row or column (e.g., 4 LABs). These types of conductors are generally referred to herein as "segmented conductors," and channels containing segmented conductors are referred to herein as "segmented channels."

The horizontal and vertical channels of a PLD can allow the LABs of the PLD to communicate with each other. Communications between a given pair of LABs can require the use of only a single conductor channel (e.g., LABs in the same row or column can communicate using a single horizontal or vertical channel, respectively) or can require the use of multiple conductor channels (e.g., LABs that are laid out diagonally from each other might communicate using a horizontal channel in combination with a vertical channel). In addition, certain routing architectures can allow adjacent LABs to communicate with each other without the use of any conductor channel (e.g., because an output of one LAB can be selectably coupled to an input of an adjacent LAB). In general, the latency of communicating with another LAB using a single conductor channel (or without using any routing channels) tends to be lower than the latency of communicating with another LAB using multiple routing channels.

In view of the foregoing, it would be desirable to provide an architecture that allows each LAB to communicate with a greater number of other LABs using only a single conductor channel. Additionally, it would be desirable to provide an architecture that allows each LAB to communicate with a greater number of other LABs without using any conductor channel.

SUMMARY OF THE INVENTION

In accordance with this invention, a staggered LAB architecture can be provided. In one embodiment of the invention, an IC device can include a first group of LABs substantially aligned with each other, and a second group of LABs substantially aligned with each other and coupled to the first group of LABs by a plurality of horizontal and vertical conductors. Each LAB in the first and second groups can include the same number of LEs (e.g., eight). The first group of LABs can be substantially offset from the second group of LABs by half the number of LEs in each LAB (e.g., four). The offsetting can be vertical or horizontal, depending on the design of the IC and its LABs.

In another embodiment of the invention, an IC device can include a first column of LABs, a second column of LABs, vertical conductors coupled to and arranged between the first and second columns of LABs, and horizontal conductors coupled to the first and second columns of LABs. A first at least one LAB in the first column of LABs can be vertically substantially offset from a second at least one LAB in the second column of LABs. Advantageously, a LAB of the first at least one LAB can be coupled to communicate with a greater number of LABs in the second at least one LAB, without using any of the plurality of vertical conductors, than if the first at least one LAB and the second at least one LAB were not vertically offset. For example, the vertical offsetting can allow the LAB to communicate with more blocks using only a single horizontal conductor, or no routing conductor at all, than if the LABs were not vertically offset.

In yet another embodiment of the invention, an IC device can include a first column of LABs, and a second column of LABs coupled to the first column of LABs by a plurality of horizontal and vertical conductors. The second column of LABs can be substantially offset vertically from the first column of LABs. In addition, the IC device can include an L-shaped input/output (I/O) interface coupled to the first and second columns of LABs. The L-shaped I/O interface can be substantially adjacent to at least one edge of the first column of LABs, at least one edge of the second column of LABs, and at least one edge of the IC device.

The invention advantageously provides an architecture that allows each LAB to communicate with a greater number of other LABs using only a single conductor channel. Additionally, the invention provides an architecture that allows each LAB to communicate with a greater number of other LABs without using any conductor channel.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
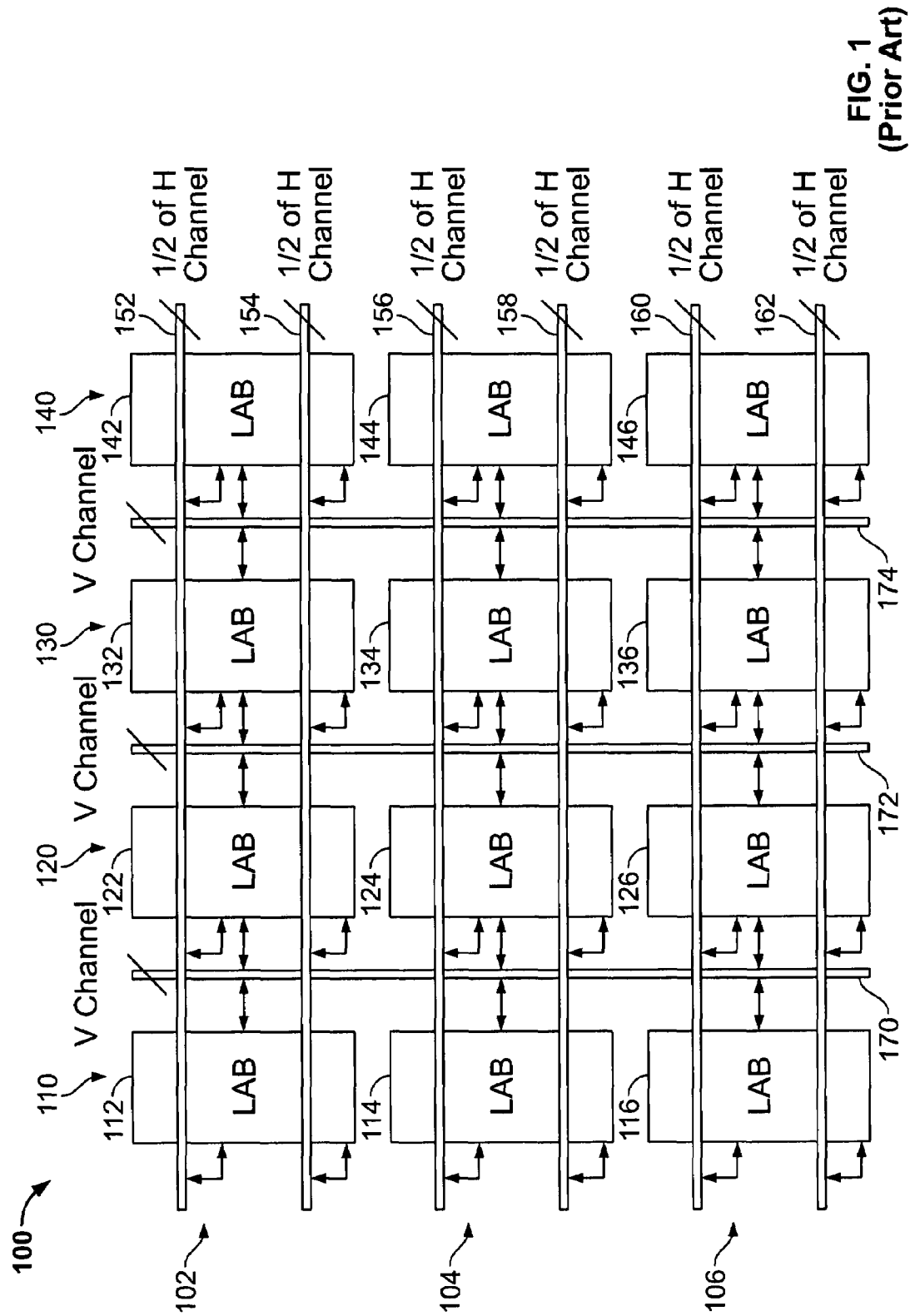
FIG. 1 is a block diagram showing a known LAB architecture.

FIG. 1 is a block diagram showing a known LAB architecture 100. LAB architecture 100 can include any suitable number of LABS, coupled to each other with vertical and horizontal routing channels. (As used herein, the term "coupled" should be understood to generically encompass both direct and indirect connections between two structures, including physical connection through intermediate mechanical modules, electrical modules, or any other suitable components or combinations thereof, as well as connections that occur via communication passing through electrical modules, wiring, air, or any other suitable medium or combination thereof.) In the example illustrated in FIG. 1, LAB architecture 100 can include at least twelve LABs, laid out in four columns 110, 120, 130, and 140 and three rows 102, 104, and 106.

The LABs depicted in FIG. 1 can communicate with each other using vertical channels 170, 172, and 174, along with horizontal half-channels 152, 154, 156, 158, 160, and 162. Each channel can include any suitable number of signal conductors, and the channels can be coupled to each other and to the appropriate LABs through programmable or otherwise selectable connections (e.g., using multiplexers, switches, or any other suitable circuitry). It will be noted that each horizontal channel is depicted as two half-channels for ease of comparison with FIG. 3, discussed later herein. Each horizontal and vertical channel can be a segmented horizontal or vertical channel, containing segmented conductors. For instance, each horizontal channel depicted in FIG. 1 might allow a given LAB to communicate with four LABs on the left or the right of that LAB, and such a segmented horizontal channel might be referred to as an "H4" channel. Similarly, each vertical channel depicted in FIG. 1 might allow a given LAB to communicate with four LABs on the top or bottom of that LAB, and such a segmented vertical channel might be referred to as a "V4" channel.

Assuming, for purposes of illustration, that the horizontal and vertical channels of LAB architecture 100 are H4 and V4 channels, respectively, and that LAB architecture 100 contains more LABs than the twelve depicted in FIG. 1, the number of channels, or "hops," required to transmit a signal from one LAB to another can be analyzed. For example, a given LAB can communicate with four LABs on its left and four LABs on its right, or a total of eight LABs, using a single H4 channel. On the other hand, a given LAB can communicate with eight LABs in the same column using a single V4 channel, and can also communicate with eight LABs in each adjacent column using a single V4 channel, yielding a total of twenty-four LABs reachable in a single vertical hop. This discrepancy in the number of LABs reachable with a single H4 channel and a single V4 channel is caused by the fact that vertical channels are laid out substantially between columns of LABs, while horizontal channels are laid out above rows of LABs, in LAB architecture 100 of FIG. 1. Further details about such a LAB architecture can be found in U.S. patent application Ser. No. 10/140,287, filed May 6, 2002, entitled "ROUTING ARCHITECTURE FOR A PROGRAMMABLE LOGIC DEVICE," now U.S. Pat. No. 6,630,842, which is hereby incorporated by reference herein in its entirety. In addition, LAB architecture 100 can be designed such that each LAB can communicate with the LAB immediately on its left and the LAB immediately on its right without using any H4 or V4 channels, because outputs of the LEs in each LAB can be coupled to drive input multiplexers of horizontally adjacent LABs. Such coupling is discussed in greater detail below in connection with FIG. 2.

Figure 2:
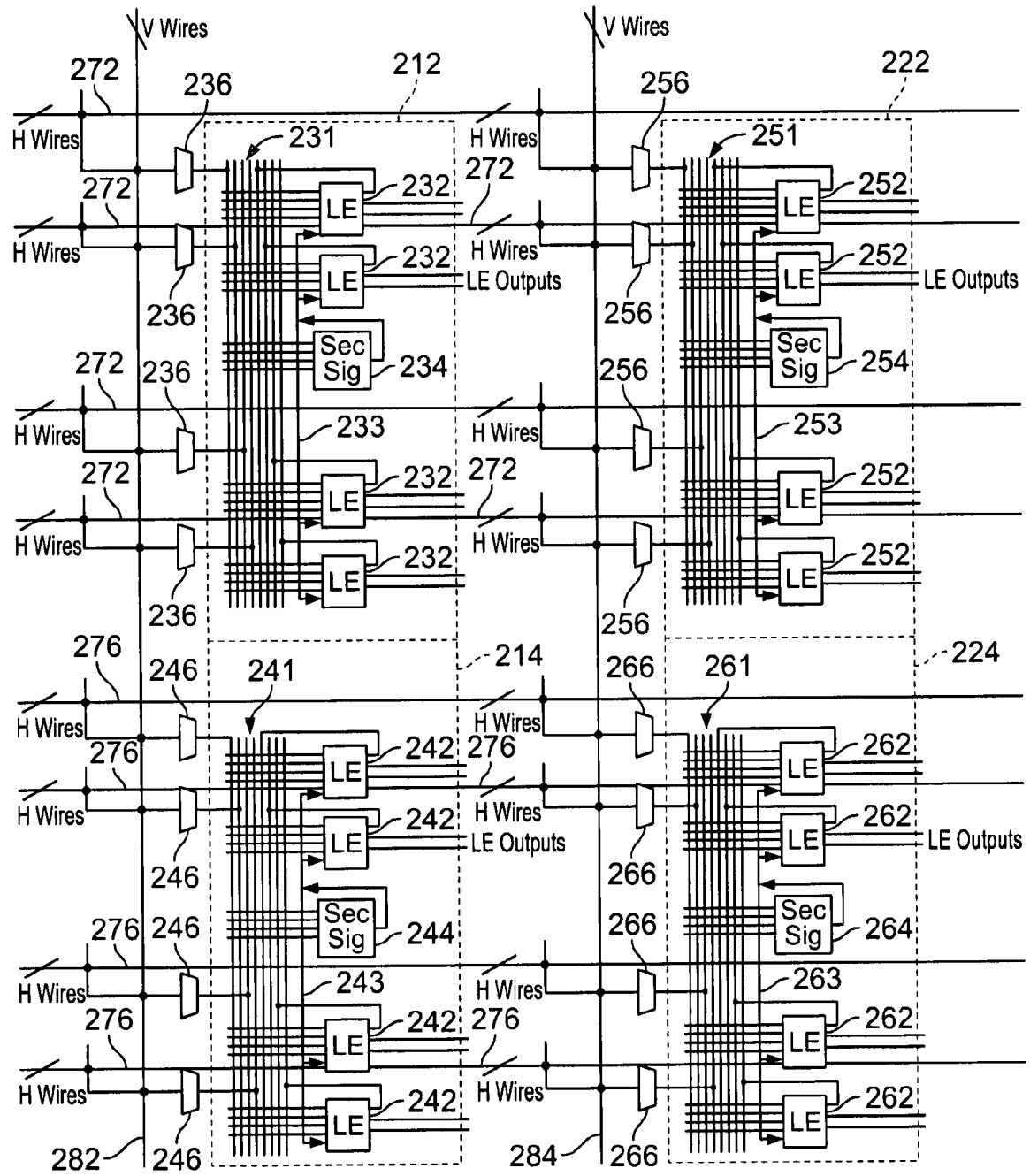
FIG. 2 is a block diagram showing several LABs laid out adjacent to each other.

FIG. 2. is a block diagram showing several LABs 212, 214, 222, and 224, laid out adjacent to each other on the same IC device. As shown, each LAB can include a plurality of LEs and a secondary signal region, all coupled to each other using internal routing conductors or wires inside of the LAB (e.g., internal routing conductors or wires 231, 241, 251, or 261). For instance, LAB 212 can include four LEs 232 and secondary signal region 234. Each LE 232 can provide a combinational logic function such as a LUT, and one or more flip-flops. Secondary signal region 234 can provide any suitable signals to LEs 232 via internal signal conductors or wires 233, including clock signals and control signals (e.g., enable signals, reset signals, and clear signals). LABs 214, 222, and 224 can include components similar to those of LAB 212 and be laid out in a similar fashion. It will be noted that each LAB can include any suitable number of LEs and secondary signal regions.

As demonstrated by FIG. 2, LEs in different LABs can communicate with each other using appropriate signal conductors. For example, vertical channel 282 can allow an LE in any of LABs 212, 214, 222, and 224 to communicate with an LE in any of those same LABs, as well as with other LABs in the same columns (for the length of vertical channel 284, which may be a segmented channel) by appropriate operation of multiplexers, such as multiplexers 256 and 266. (Although FIG. 2 may suggest that LABs 212 and 214 can drive vertical channel 284, while LABs 222 and 224 cannot, it should be noted that various connections and circuitry have been omitted from FIG. 2 for clarity, and many routing architectures could allow LABs 222 and 224 to drive vertical channel 284, which could in turn provide inputs to LABs 212 and 214.) Similarly, horizontal conductors 272 can allow an LE in either of LABs 212 or 222 to communicate with the other LAB, as well as with other LABs in the same row (for the length of horizontal conductors 272, which may be a segmented channel), by appropriate operation of multiplexers, such as multiplexers 256 and 266. (Although FIG. 2 may suggest that LAB 212 can drive horizontal conductors 272, while LAB 222 cannot, it should be noted that various connections and circuitry have been omitted from FIG. 2 for clarity, and many routing architectures could allow LAB 222 to drive horizontal conductors 272, which could in turn provide inputs to LAB 212.)

Additionally, LABs that are laid out in the same row can often communicate with the two LABs that are directly horizontally adjacent to it without using any horizontal or vertical routing channels. For example, an LE from LAB 212 could transmit signals to an LE in LAB 222, and an LE from LAB 222 could transmit data to an LE in LAB 212, both without using horizontal conductors 272. Such signal transmission can be achieved because LE outputs of one LAB can often be coupled to LE inputs of another LAB through appropriate multiplexer circuitry (for simplicity of illustration, such connections are not shown in FIG. 2).

Figure 3:
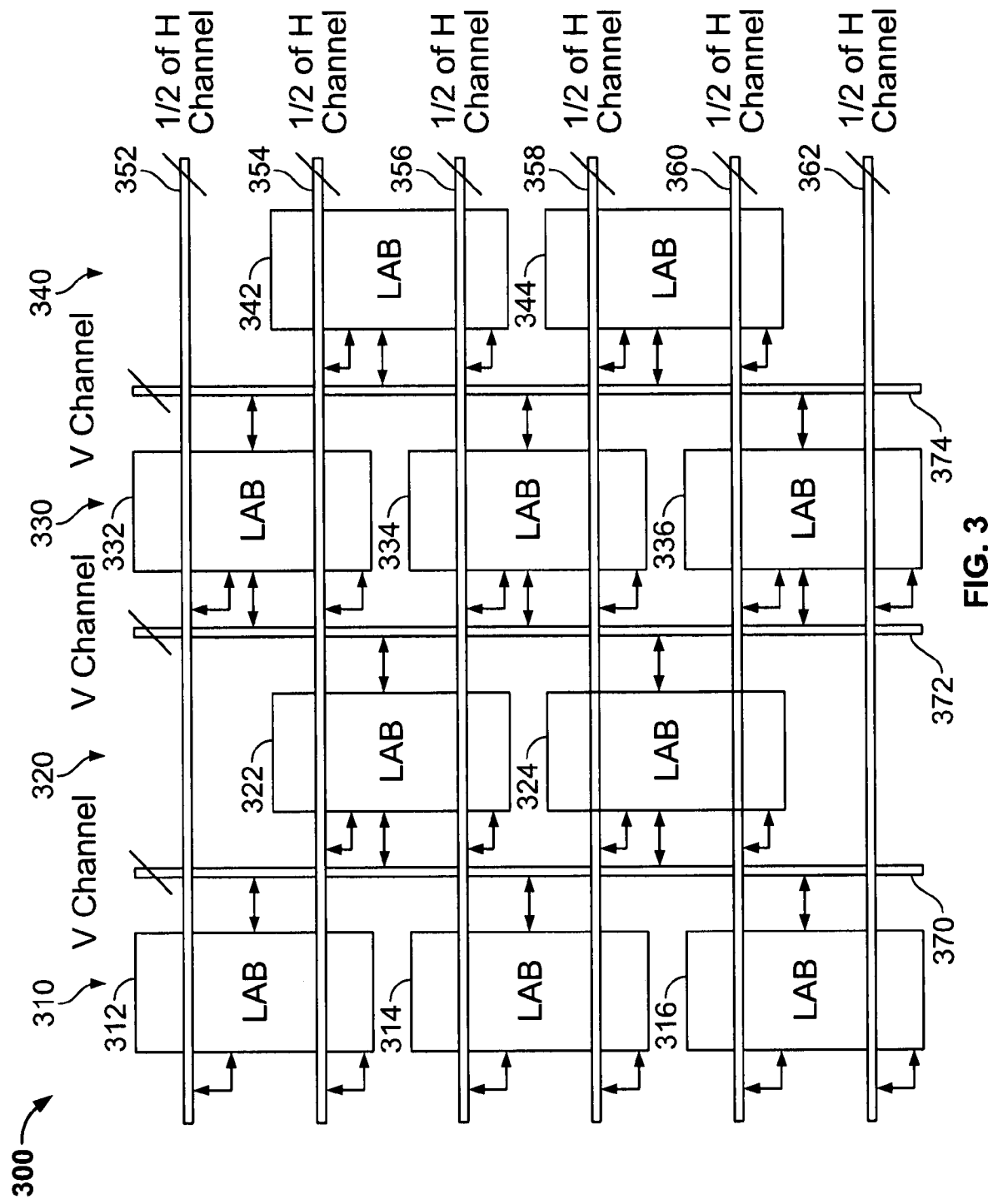
FIG. 3 is a block diagram showing an illustrative staggered LAB architecture in accordance with an embodiment of the invention.

FIG. 3 is a block diagram showing an illustrative staggered LAB architecture 300 in accordance with an embodiment of the invention. Staggered LAB architecture 300 can include any suitable number of LABs, coupled to each other with vertical and horizontal routing channels. In the example illustrated in FIG. 3, LAB architecture 300 can include at least ten LABs, laid out in four columns 310, 320, 330, and 340. In accordance with an embodiment of the invention, LABs 322 and 324 in column 320, and LABs 342 and 344 in column 340, can be substantially offset from the LABs in columns 310 and 330, resulting in a substantially staggered LAB architecture. In one embodiment, the LABs in columns 320 and 340 can be vertically offset from the LABs in columns 310 and 330 by approximately half the height of each LAB. For example, assuming that each LAB in LAB architecture 300 contains four LEs, the LABs in columns 320 and 340 can be vertically offset from the LABs in columns 310 and 330 by the height of two LEs. It will be noted that the concepts of the invention can be used with LABs containing any suitable number of LEs and any suitable structure or layout.

As was the case with LAB architecture 100 of FIG. 1, the LABs depicted in FIG. 3 can communicate with each other using vertical channels 370, 372, and 374, along with horizontal half-channels 352, 354, 356, 358, 360, and 362. Each channel can include any suitable number of signal conductors, and the channels can be coupled to each other and to the appropriate LABs through programmable or otherwise selectable connections (e.g., using multiplexers, switches, or any other suitable circuitry). It will be noted that each horizontal channel is depicted as two half-channels for ease of discussion. Each horizontal and vertical channel can be a segmented horizontal or vertical channel, containing segmented conductors. For instance, each horizontal channel depicted in FIG. 3 might allow a given LAB to communicate with four LABs on the left or the right of that LAB, and such a segmented horizontal channel might be referred to as an "H4" channel. Similarly, each vertical channel depicted in FIG. 3 might allow a given LAB to communicate with four LABs on the top or bottom of that LAB, and such a segmented vertical channel might be referred to as a "V4" channel. It will be noted that segmented horizontal and vertical channels of any appropriate length can be used with the invention.

In accordance with an embodiment of the invention, the vertical offsetting of the LABs in columns 320 and 340 can advantageously allow a given LAB to communicate with more LABs using only one or zero routing channels. Assuming, for purposes of illustration, that the horizontal and vertical channels of LAB architecture 300 are H4 and V4 channels, respectively, and that LAB architecture 300 contains more LABs than the twelve depicted in FIG. 3, the number of channels, or "hops," required to transmit a signal from one LAB to another can be analyzed. For example, a given LAB can communicate with six LABs on its left and six LABs on its right, or a total of twelve LABs, using a single H4 channel. In addition, a given LAB can communicate with eight LABs in the same column using a single V4 channel, and can also communicate with eight LABs in each adjacent column using a single V4 channel, yielding a total of twenty-four LABs reachable in a single vertical hop. This discrepancy in the number of LABs reachable with a single H4 channel and a single V4 channel is caused by the fact that vertical channels are laid out substantially between columns of LABs, while horizontal channels are laid out above rows of LABs, in LAB architecture 300 of FIG. 3. In addition, LAB architecture 300 can be designed such that each LAB can communicate with the two LABs immediately on its left and the two LABs immediately on its right without using any H4 or V4 channels, because outputs of the LEs in each LAB can be coupled to drive input multiplexers of horizontally adjacent LABs. Accordingly, the offsetting of certain LABs relative to adjacent LABs can advantageously increase the number of LABs reachable from any given LAB in one or zero hops when compared to traditional grid-style LAB architectures, such as LAB architecture 100 depicted in FIG. 1. In this fashion, the overall latency of inter-LAB communication on the IC device (e.g., PLD) using such a LAB architecture can be reduced, and the system as a whole can operate at a higher frequency.

It will be noted that concepts of the invention can be used with staggering or offsetting schemes, and to various groups of LABs, aside from the one illustrated in FIG. 3. For instance, columns of LABs do not have to be offset by approximately a half-LAB height relative to adjacent columns. As an example, a LAB architecture can be designed, in accordance with an embodiment the invention, where each column of LABs is offset by approximately one LE relative to the column to its left, resulting in an incremental offset across a series of columns of LABs. Alternatively, rows of LABs can be horizontally shifted relative to each other by any suitable amount. Similarly, principles of the invention can be applied to LAB architectures where both horizontal and vertical channels are laid out above the LABs, where both horizontal and vertical channels are laid out between rows and columns of LABs, where horizontal channels are laid out between LABs and vertical channels are laid out above LABs, or with any other suitable arrangement. As yet another example, concepts of the invention can be implemented with LABs that do not contain the same number of LEs.

Figure 4:
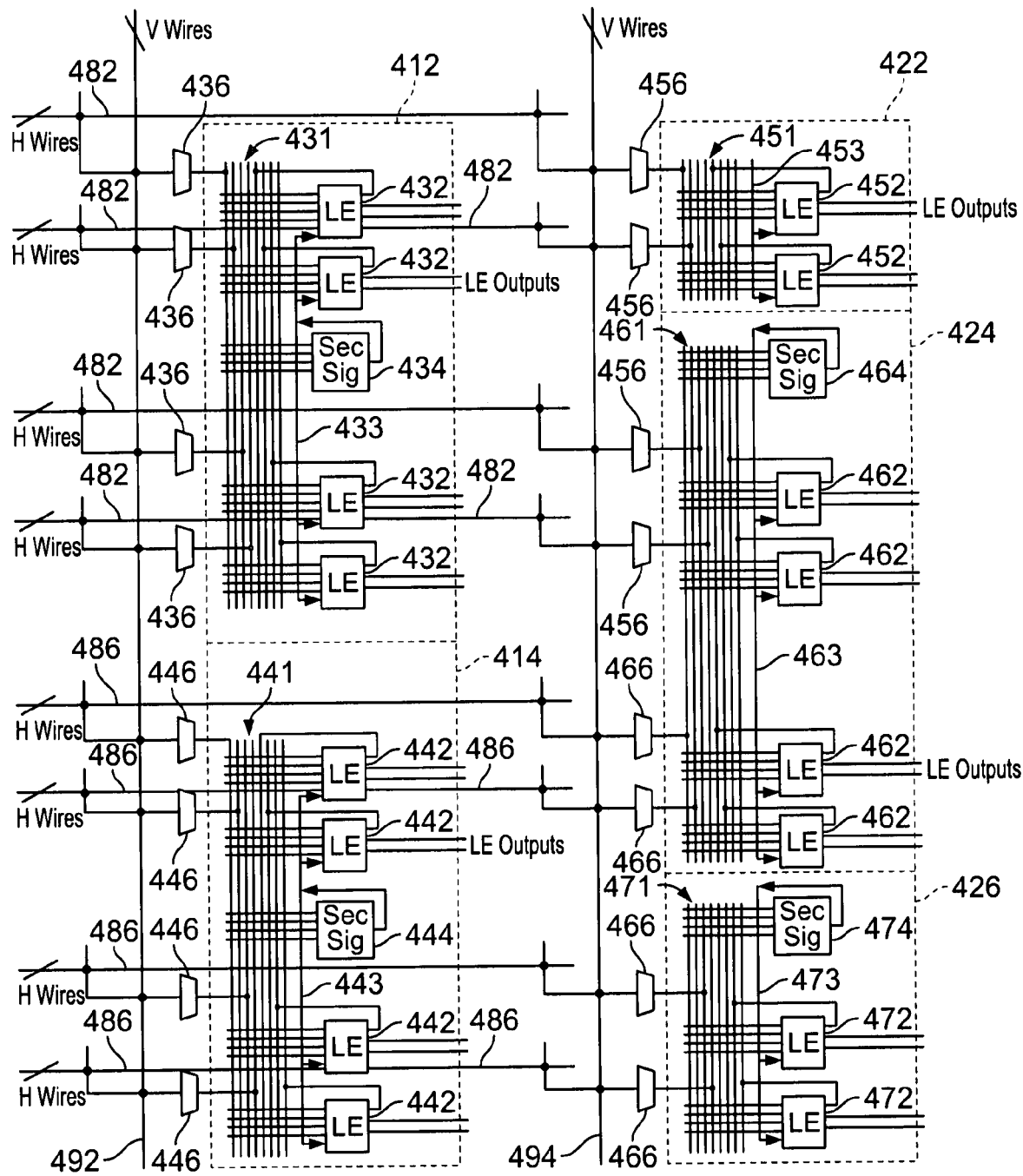
FIG. 4 is a block diagram showing several LABs laid out adjacent to each other in a staggered LAB architecture in accordance with an embodiment of the invention.

FIG. 4 is a block diagram showing several LABs 412, 414, 422, 424, and 426 laid out adjacent to each other in a staggered LAB architecture in accordance with an embodiment of the invention. As shown, each LAB can include a plurality of LEs and a secondary signal region, all coupled to each other using internal routing conductors or wires inside of the LAB (e.g., internal routing conductors or wires 431, 441, 451, 461, or 471). For instance, LAB 412 can include four LEs 432 and secondary signal region 434. Each LE 432 can provide a combinational logic function such as a LUT, and one or more flip-flops. Secondary signal region 434 can provide any suitable signals to LEs 432 using internal signal conductors or wires 433, including clock signals and control signals (e.g., enable signals, reset signals, and clear signals). LABs 414, 422, 424, and 426 can include components similar to those of LAB 412 and be laid out in a similar fashion. It will be noted that each LAB can include any suitable number of LEs and secondary signal regions, and the invention is not limited in these respects.

As demonstrated by FIG. 4, LEs in different LABs can communicate with each other using appropriate signal conductors. For example, vertical channel 494 can allow an LE in any of LABs 412, 414, 422, 424, and 426 to communicate with an LE in any of those same LABs, as well as with other LABs in the same columns (for the length of vertical channel 494, which may be a segmented channel) by appropriate operation of multiplexers, such as multiplexers 456 and 466. (Although FIG. 4 may suggest that LABs 412 and 414 can drive vertical channel 494, while LABs 422, 424, and 426 cannot, it should be noted that various connections and circuitry have been omitted from FIG. 4 for clarity, and many routing architectures could allow LABs 422, 424, and 426 to drive vertical channel 494, which could in turn provide inputs to LABs 412 and 414.)

In accordance with an embodiment of the invention, horizontal conductors 482 can allow an LE in LAB 412 to communicate with both LAB 422 and LAB 424, as well as other LABs that are horizontally aligned with LAB 412 (for the length of horizontal conductors 482, which may be segmented conductors), by appropriate operation of multiplexers, such as multiplexers 456. Similarly, horizontal conductors 482 can allow an LE in LAB 424 to communicate with both LAB 412 and LAB 414, as well as other LABs that are horizontally aligned with LAB 424 (for the length of horizontal conductors 482, which may be segmented conductors), by appropriate operation of multiplexers. (Although FIG. 4 may suggest that LAB 412 can drive horizontal conductors 482, while LAB 424 cannot, it should be noted that various connections and circuitry have been omitted from FIG. 4 for clarity, and many routing architectures could allow LAB 424 to drive horizontal conductors 482, which could in turn provide inputs to LABs 412 and 414.)

Additionally, in accordance with an embodiment of the invention, LABs such as those shown in FIG. 4 can communicate with LABs that are directly horizontally adjacent to it without using any horizontal or vertical routing channels. For example, an LE from LAB 412 could transmit signals to LEs in LAB 422 and LAB 424, and an LE from LAB 424 could transmit data to LEs in LABs 412 and 414, both without using horizontal conductors 482 or 486. Such signal transmission can be achieved because LE outputs of one LAB can be coupled to LE inputs of another LAB through appropriate multiplexer circuitry (for simplicity of illustration, such connections are not shown in FIG. 4).

It will be noted that the shifting of LABs in different columns relative to each other can be achieved with relatively little change in layout. For instance, intra-LAB conductors or wires 451, 461, and 471 can be broken at different vertical positions than intra-LAB conductors or wires 431 and 441. Similarly, intra-LAB conductors or wires 453, 463, and 473, used to convey signals between a secondary signal region (e.g., secondary signal region 464 or 474) and the LEs in the same LAB, can be broken at different vertical positions than intra-LAB conductors or wires 433 and 443. In an embodiment of the invention, these changes to the intra-LAB conductors or wires are the only changes needed to vertically shift LABs 422, 424, and 426 relative to LABs 412 and 414. For example, inter-LAB conductors and multiplexers used to facilitate inter-LAB communication can be left substantially unaltered. In addition, the positions of LEs 452, 462, and 472 and secondary signal regions 464 and 474 can advantageously be left substantially unaltered. Such an approach to shifting LABs can result in secondary signal regions being positioned in different spots within individual LABs of different columns (e.g., secondary signal regions 464 and 474 can be positioned near the top of respective LABs 424 and 426, while secondary signal regions 434 and 444 can be positioned near the middle of respective LABs 412 and 414). However, this approach can advantageously avoid the potentially costly operations needed to reposition the secondary signal regions, which can be of a substantially different size from the LEs in the same column of LABs.

Thus, concepts of the invention can be implemented on physical IC devices with relatively minimal changes to layouts. Similar principles can be applied to other LAB shifts in accordance with the invention, such as vertical shifts by an amount other than half the number of LEs in a given LAB, and horizontal shifts of rows of LABs relative to other rows of LABs. It will also be noted that concepts of the invention can be implemented with LABs that do not contain the same number of LEs.

Figure 5:
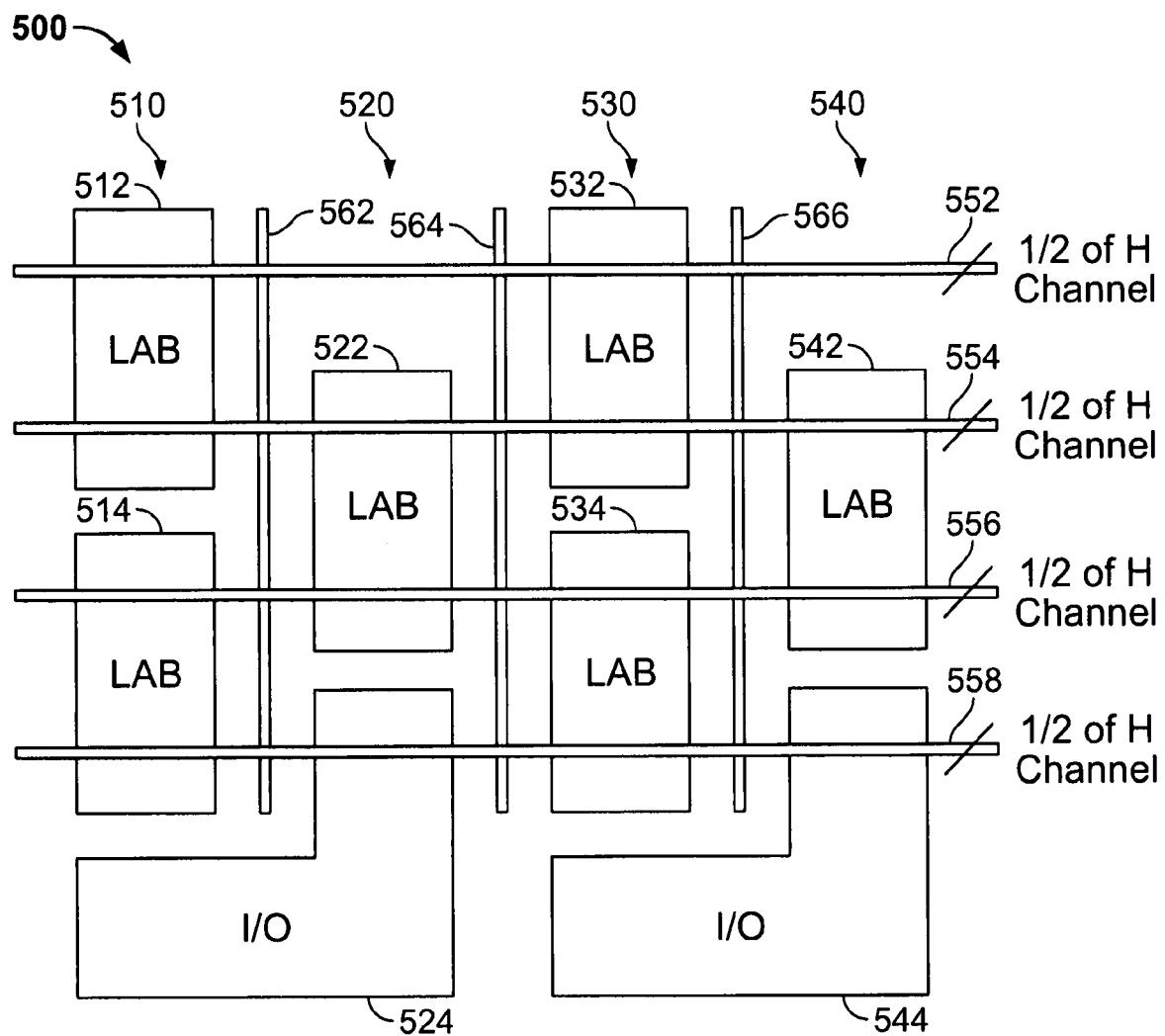
FIG. 5 is a block diagram of an illustrative staggered LAB architecture with L-shaped I/O interfaces in accordance with an embodiment of the invention.

FIG. 5 is a block diagram of an illustrative staggered LAB architecture 500 with L-shaped I/O interfaces 524 and 544 in accordance with an embodiment of the invention. The shifting of columns of LABs can leave unoccupied space at the edges of an IC device (e.g., a PLD). For instance, the shifting of columns 520 and 540, assuming they are positioned near the bottom of the IC device, can leave gaps at the bottoms of those columns. One approach for taking advantage of this leftover space might be to lay out smaller LABs below LABs 522 and 542. Alternatively, LABs 522 and 542 could be extended to include a greater number of LEs than most of the other LEs on the IC device.

In accordance with an embodiment of the invention, yet another way of taking advantage of the leftover space would be to place L-shaped I/O interfaces, such as I/O interfaces 524 and 544, at the edges of the IC device. Such I/O interfaces can communicate with the plurality of LABs in the IC device, as well as with circuitry external to the IC device, and can include transmitter and receiver circuitry for performing such communications. Such L-shaped I/O interfaces could include a significant amount of multiplexer circuitry, which can advantageously be placed relatively easily in the space left open by the shifting of a column of LABs. It will be understood that such I/O interfaces can be applied for other LAB architectures (e.g., where rows of LABs are shifted instead of columns, or columns are shifted by a different amount than half the height of a LAB).

Figure 6:
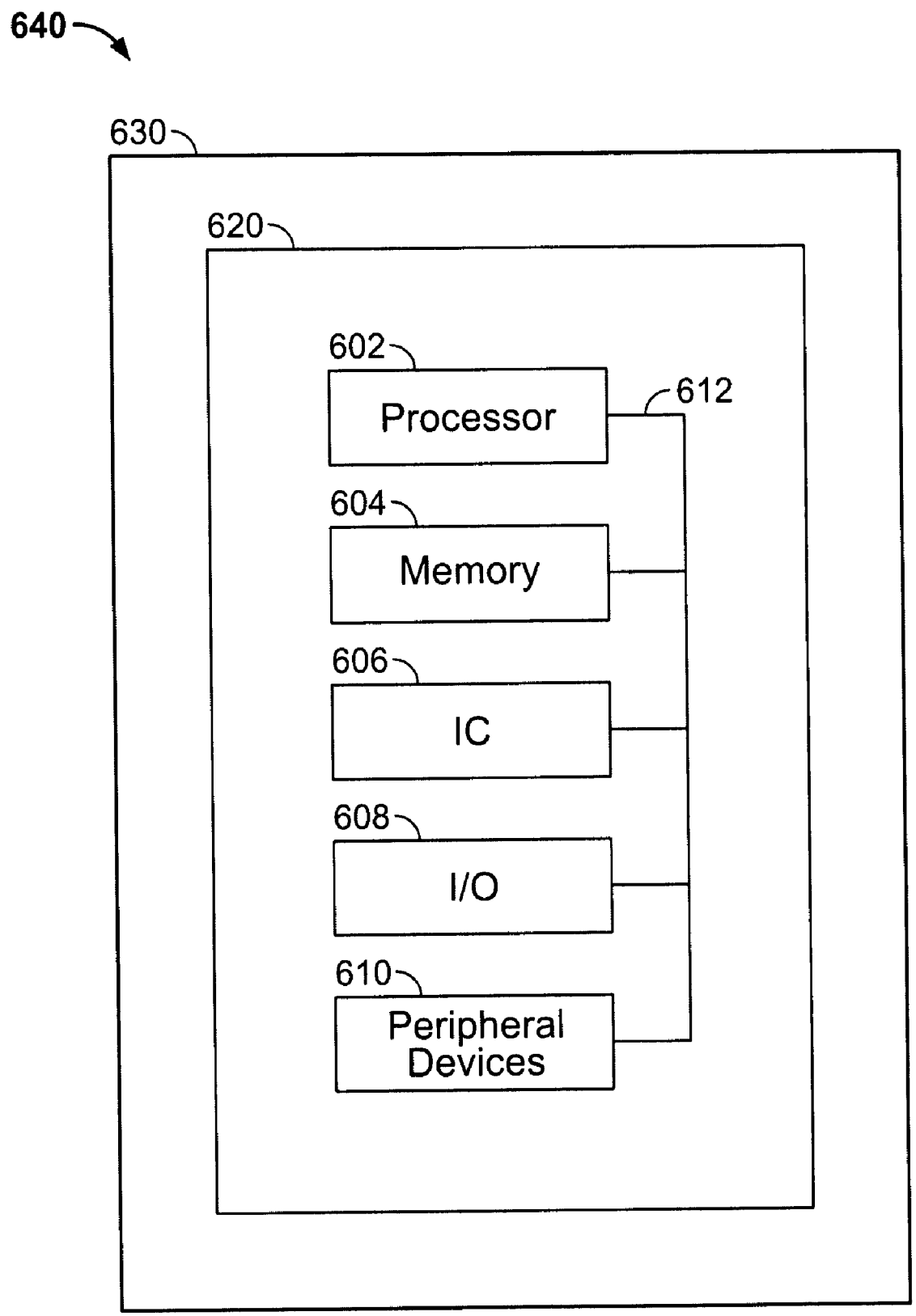
FIG. 6 is a block diagram of a data processing system incorporating the invention.

FIG. 6 illustrates an IC 606, which incorporates a staggered LAB architecture in accordance with this invention, in a data processing system 640. IC 606 may be a PLD, an ASIC, or a device possessing characteristics of both a PLD and an ASIC. Data processing system 640 may include one or more of the following components: processor 602; memory 604; I/O circuitry 608; and peripheral devices 610. These components are coupled together by a system bus 612 and are populated on a circuit board 620 which is contained in an end-user system 630.

System 640 can be used in a wide variety of applications, such as computer networking, data networking, instrumentation, video processing, or digital signal processing. IC 606 can be used to perform a variety of different logic functions. For example, IC 606 can be configured as a processor or controller that works in cooperation with processor 602. IC 606 may also be used as an arbiter for arbitrating access to a shared resource in system 640. In yet another example, IC 606 can be configured as an interface between processor 602 and one of the other components in system 640.

Thus it is seen that a staggered LAB architecture can be provided on an IC device. One skilled in the art will appreciate that the invention can be practiced by other than the described embodiments, which are presented for purposes of illustration and not of limitation, and the present invention is limited only by the claims which follow.

What is claimed is:

1. An integrated circuit (IC) device comprising:
    a first group of logic array blocks (LABS) substantially aligned with each other parallel to a line; and
    a second group of LABs substantially aligned with each other paralled to said line and spaced from the first group of LABs perpendicular to said line, the second group of LABs being coupled to the first group of LABs by a plurality of horizontal and vertical conductors, wherein:
    each LAB in the first and second groups comprises (1) a same plural number of logic elements (LEs), each of which LEs can provide a look-up table combinational logic function, and (2) a secondary signal region for providing clock signals to the LEs in the LAB; and
    the first group of LABs is substantially offset from the second group of LABs parallel to said line by half the number of LEs in each LAB.

2. The IC device of claim 1 wherein:
    the first group of LABs comprises a first column of LABs;
    the second group of LABs comprises a second column of LABs; and the first group of LABs is vertically offset from the second group of LABs by half the number of LEs in each LAB.

3. The IC device of claim 2 wherein at least some of the vertical conductors are laid out substantially between the first and second columns of LABs.

4. The IC device of claim 2 wherein at least some of the horizontal conductors are laid out substantially above LABs of the first and second columns of LABs.

5. The IC device of claim 4 wherein a LAB of the first group of LABs is coupled to communicate with at least two LABs of the second group of LABs using at least some of the horizontal conductors without using any of the vertical conductors.

6. The IC device of claim 1 further comprising an L-shaped input/output (I/O) interface coupled to the first and second groups of LABs by at least some of the plurality of horizontal and vertical conductors, and substantially adjacent to at least one edge of the first group of LABs, at least one edge of the second group of LABs, and at least one edge of the IC device.

7. The IC device of claim 1 wherein the IC device is a programmable logic device.

8. A printed circuit board on which is mounted the IC device of claim 1.

9. A digital processing system comprising:
processing circuitry;
a memory coupled to the processing circuitry; and
the IC device of claim 1 coupled to the processing circuitry and the memory.

10. An integrated circuit (IC) device comprising:
a first column of logic array blocks (LABS) that can provide look-up table combinational logic functions;
a second column of LABs that can provide look-up table combination logic functions;
vertical conductors coupled to and arranged between the first and second columns of LABs; and
horizontal conductors couple to the first and second columns of LABs, wherein:

a first at least one LAB in the first coluumn of LABs is vertically substantially offset from at least a subplurality of the LABs in the second column of LABs, such that a LAB of the first at least one LAB is coupled to communicate with a greater number of LABs in the subplurality, without using any of the plurality of vertical conductors, than if the first at least one LAB and the subplurality were not vertically offset, and werein:

each LAB of the first and second columns of LABs comprises (1) a same plural number of logic elements (LEs), each of which LEs can provide a look-up table combinational logic function, and (2) a secondary signal region for providing clock signals to the LEs in the LAB; and a LAB of the first at least one LAB is offset from the subplurality by one LE.

11. The IC device of claim 10 further comprising an L-shaped input/output (I/O) interface coupled to the first and second columns of LABs by at least some of the plurality of horizontal and vertical conductors, and substantially adjacent to at least one edge of the first column of LABs, at least one edge of the second column of LABs, and at least one edge of the IC device.

12. The IC device of claim 11 wherein the L-shaped I/O interface is substantially adjacent to at least two edges of the first column of LABs.

13. The IC device of claim 10 wherein the IC device is a programmable logic device.

14. A printed circuit board on which is mounted the IC device of claim 10.

15. A digital processing system comprising:
processing circuitry;
a memory coupled to the processing circuitry; and
the IC device of claim 10 coupled to the processing circuitry and the memory.

* * * * *